United States Patent
Nickel et al.

(10) Patent No.: US 7,151,652 B2
(45) Date of Patent: Dec. 19, 2006

(54) TOP-PINNED MAGNETORESISTIVE DEVICE HAVING ADJUSTED INTERFACE PROPERTY

(75) Inventors: Janice H. Nickel, Sunnyvale, CA (US); Manish Sharma, Sunnyvale, CA (US)

(73) Assignee: Hewett-Packard Development Company, L.P., Houston, TX (US)

( * ) Notice: Subject to any disclaimer, the term of this patent is extended or adjusted under 35 U.S.C. 154(b) by 296 days.

(21) Appl. No.: 10/464,161

(22) Filed: Jun. 18, 2003

(65) Prior Publication Data

US 2004/0257720 A1    Dec. 23, 2004

(51) Int. Cl.
*G11B 5/39*    (2006.01)

(52) U.S. Cl. .................... 360/324.11; 360/324.2

(58) Field of Classification Search .................... None
See application file for complete search history.

(56) References Cited

U.S. PATENT DOCUMENTS

| | | | |
|---|---|---|---|
| 6,072,382 A | 6/2000 | Daughton et al. | |
| 6,661,622 B1 | 12/2003 | Pinarbasi | |
| 6,903,909 B1 * | 6/2005 | Sharma et al. | 360/324.2 |
| 2001/0055184 A1 * | 12/2001 | Shimazawa et al. | 360/324.2 |
| 2002/0021537 A1 * | 2/2002 | Hasegawa et al. | 360/324.11 |

* cited by examiner

*Primary Examiner*—A. J. Heinz

(57) ABSTRACT

A top-pinned magnetoresistive device includes a free ferromagnetic layer; a spacer layer on the free layer; and a pinned ferromagnetic layer on the spacer layer. At least one interface property at an upper surface of the pinned layer is adjusted during fabrication of the magnetoresistive device.

30 Claims, 5 Drawing Sheets

TOP-PINNED MAGNETORESISTIVE DEVICE HAVING ADJUSTED INTERFACE PROPERTY

BACKGROUND

Magnetic tunnel junctions can be used as memory elements in magnetic random access memory ("MRAM") devices. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives.

Magnetic tunnel junctions can be used as magnetic sensors in read heads of hard disk drives. The magnetic tunnel junctions can generate stronger readback signals than giant magnetoresistive devices and other conventional devices.

A conventional magnetic tunnel junction includes an antiferromagnetic (AF) pinning layer, a pinned ferromagnetic (FM) layer formed on the pinning layer, an insulating tunnel barrier formed on the pinned ferromagnetic layer, and a free ferromagnetic layer formed on the insulating tunnel barrier. Relative orientation and magnitude of spin polarization of the ferromagnetic layers determine the resistance of the magnetic tunnel junction.

In this conventional bottom-pinned magnetic tunnel junction, a lattice mismatch can occur between the AF pinning and pinned FM layers. This lattice mismatch increases the roughness on an upper surface of the pinning layer. The increased roughness, in turn, increases ferromagnetic (FM) coupling between the pinned and free layers.

The FM coupling between the pinned and free layers can cause problems in magnetic tunnel junctions. In read heads, the FM coupling can cause readback signal distortion. Bias techniques can be used to correct the signal distortion. However, the bias techniques tend to be complex to implement and costly to fabricate.

In magnetic memory elements, the FM coupling can render magnetic tunnel junctions unusable. Unusable magnetic tunnel junctions can reduce MRAM performance, increase fabrication cost, and increase the complexity of read circuits.

It would be desirable to reduce the FM coupling.

SUMMARY

According to one aspect of the present invention, a method of forming a magnetoresistive device includes forming a free ferromagnetic layer; forming a spacer layer on the free layer; forming a pinned ferromagnetic layer on the spacer layer; and adjusting at least one interface property at an upper surface of the pinned layer. Other aspects and advantages of the present invention will become apparent from the following detailed description, taken in conjunction with the accompanying drawings, illustrating by way of example the principles of the present invention.

DETAILED DESCRIPTION

Figure 1:
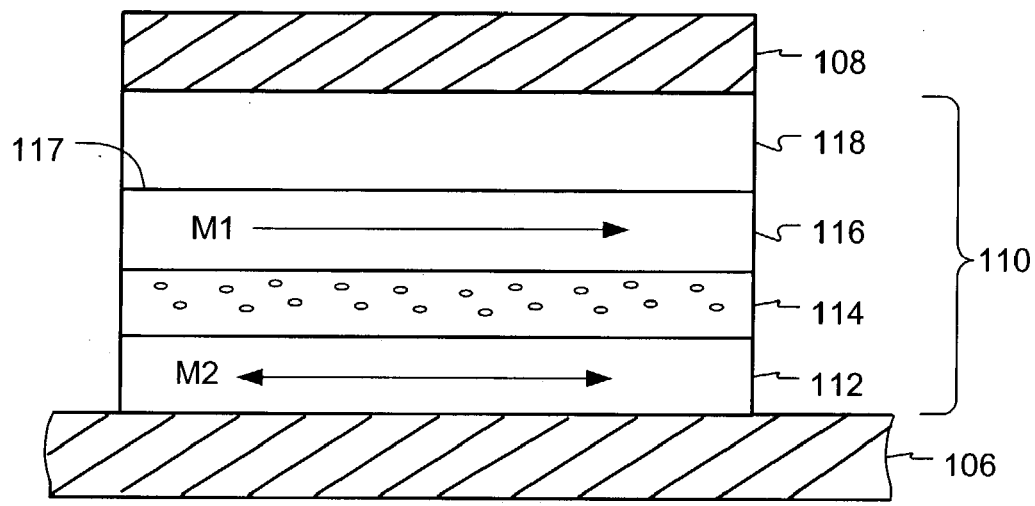
FIG. 1 is an illustration of a magnetoresistive device according to an embodiment of the present invention.

Reference is made to FIG. 1, which illustrates a top-pinned magnetic tunnel junction (MTJ) 110. The MTJ 110 includes a free FM layer 112, a spacer layer 114 formed on the free FM layer 112, a pinned FM layer 116 formed on the spacer layer 114, and an AF pinning layer 118 formed on the pinned layer 116. The MTJ 110 is considered top-pinned because the pinned layer 116 is formed after the free layer 112.

The pinned layer 116 has a magnetization vector (M1) that is oriented in a plane. The AF pinning layer 118 provides an exchange field that pins the magnetization vector (M1) of the pinned layer 116.

The free layer 112 has a magnetization vector (M2) that is allowed to rotate in the presence of an applied magnetic field in a range of interest (the magnetic field may be applied by bottom and top conductors 106 and 108). The free magnetization vector (M2) may be allowed to change between two stable orientations. In one stable orientation, the magnetization vectors (M1 and M2) are pointing in the same direction, whereby the MTJ 110 is said to have a parallel magnetization orientation. In the other stable orientation, the magnetization vectors (M1 and M2) are pointing in opposite directions, whereby the MTJ 110 is said to have an anti-parallel magnetization orientation.

The spacer layer 114 includes an insulating tunnel barrier, which allows quantum mechanical tunneling to occur between the free and pinned layers 112 and 116. This tunneling phenomenon is electron spin dependent, making the resistance across the free and pinned layers 112 and 116 (i.e., the through-plane resistance) a function of the relative orientation of the magnetization vectors (M1 and M2). Generally, the resistance of the MTJ 110 is a first value ($R_N$) when the magnetization vectors (M1 and M2) point in the same direction, and the resistance is increased to a second value ($R_N + \Delta R_N$) when the magnetization vectors (M1 and M2) point in opposite directions. The ratio $\Delta R_N / R_N$ is referred to as the tunneling magnetoresistance ratio (TMR).

An inherent advantage of the top-pinned MTJ 110 is that it has much less FM coupling than a conventional bottom-pinned MTJ. The top-pinned MTJ 110 does not suffer from surface roughness that results from a lattice mismatch between the pinned and pinning layers 116 and 118.

However, exchange coupling between the pinned and pinning layers 116 and 118 of the MTJ 110 is poor, if not corrected.

Figure 2:
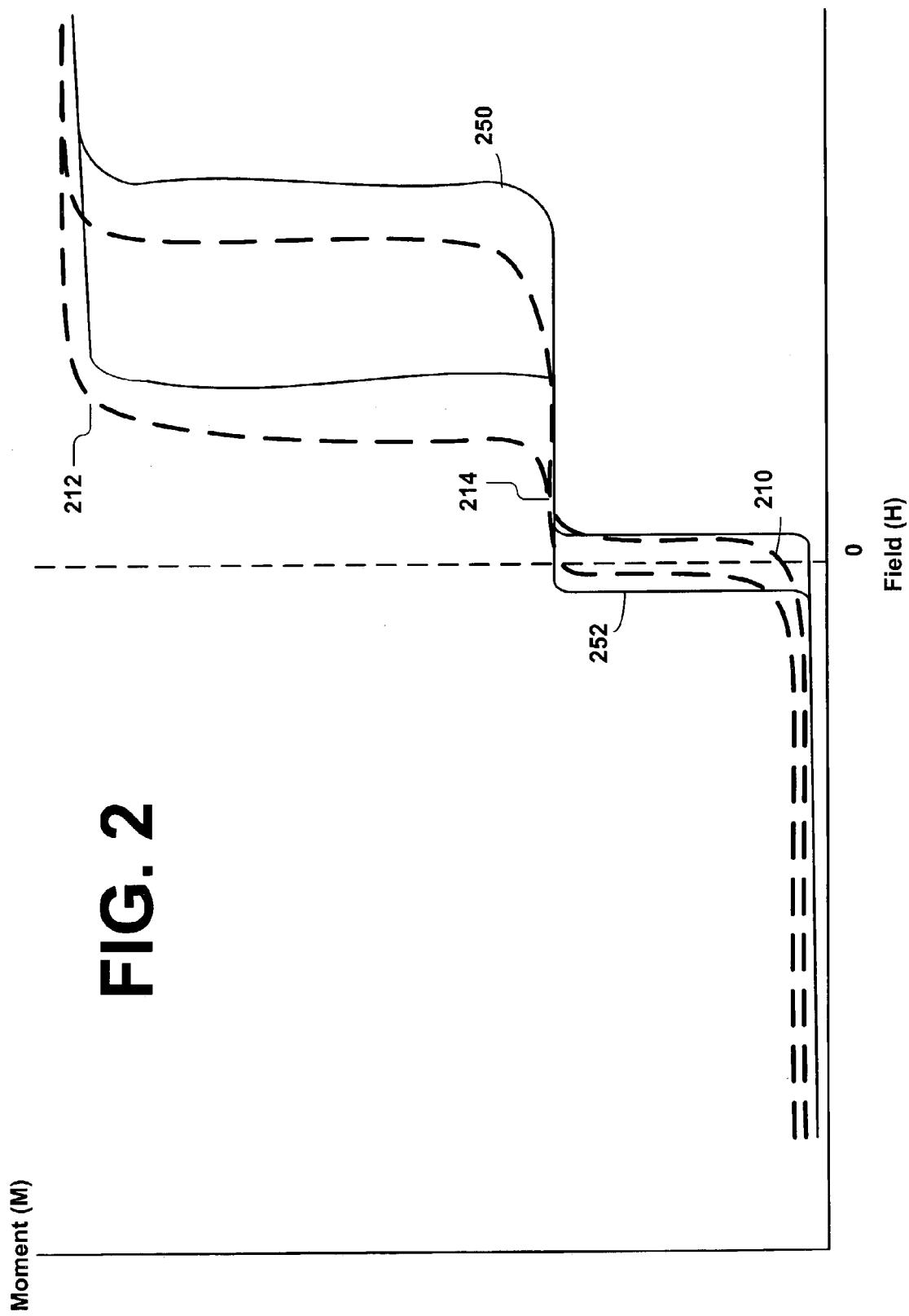
FIG. 2 is an illustration of M–H loops for the magnetoresistive device.

Additional reference is made to FIG. 2, which illustrates H–M loops 210 and 212 (in dark dash lines) for pinned and free layers of a top-pinned magnetic tunnel junction having poor exchange coupling. The pinned layer loop 210 has a long tail 214, which overlaps the free layer loop 212. This low field tail of the pinned layer loop 210 superimposes on the free layer loop 212, giving the free layer loop 212 a skew.

At least one interface property at an upper surface 117 of the pinned layer 116 is adjusted to improve the exchange coupling between the pinned and pinning layers 116 and 118. The interface refers to that region between the upper surface 117 of the pinned layer 116 and a lower surface of the pinning layer 118. The interface properties include, without limitation, roughness of the upper surface, texture (crystal orientation) at the upper surface, and grain size at the upper surface.

Ion etching of the pinned layer upper surface 117 may be performed to adjust at least one of these interface properties. The ion etching can reduce the roughness at the upper surface 117 of the pinned layer 116, and it can change the texture and grain size at the upper surface 117 of the pinned layer 116.

FIG. 2 illustrates the effects of the ion etching on the magnetic characteristics of the top-pinned magnetic tunnel junction. H-M loops 250 and 252 for the pinned and free layers 116 and 112 after interface adjustment are shown in light solid lines. The ion etching increases the distance between the pinned and free layer loops 250 and 252. In addition, the exchange field of the pinned loop 250 is increased, and squareness of the pinned loop 250 is increased.

The interface adjustment can also affect magnetic characteristics of the free layer 112. The ion etching can also slightly increase the coercivity of the free layer 112, which results in a wider free layer loop 252; it can increase the squareness of the free layer loop 252; and it can shift the free layer loop 252 to the left to compensate for any FM coupling between the free and pinned layers 112 and 116. As a result, upper surface 117 of the pinned layer 116 can be ion etched until the free layer loop 252 is centered about a zero magnetic field.

Figure 3:
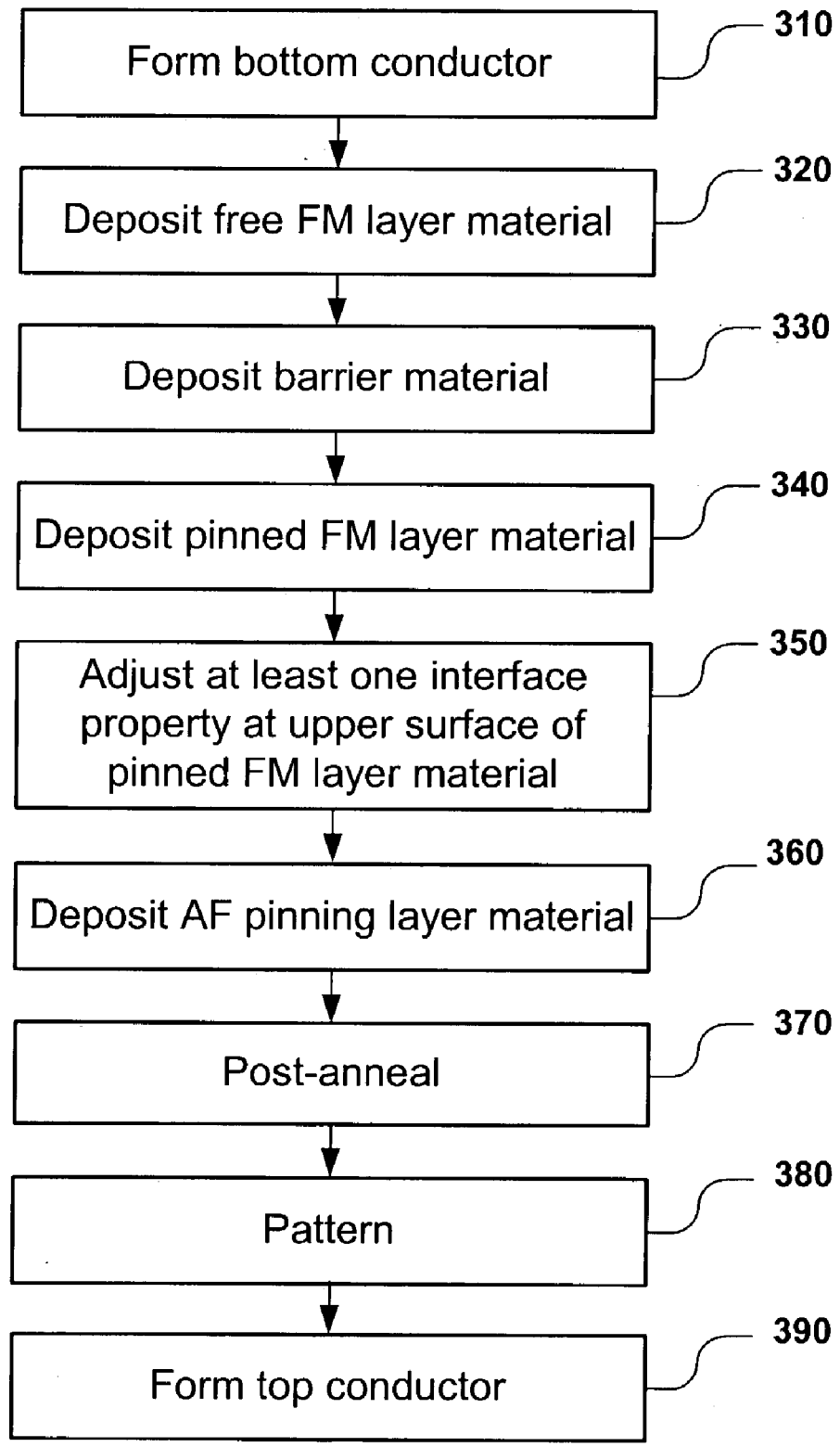
FIG. 3 is a flowchart of a method of fabricating a magnetoresistive device according to an embodiment of the present invention.

Reference is now made to FIG. 3, which illustrates an exemplary process of fabricating a magnetic tunnel junction. A bottom conductor is deposited (310). The bottom conductor may be made of a metal such as aluminum or copper.

Free FM layer material is deposited on the bottom conductor (320). Free FM layer materials may include, but is not limited to, NiFe, NiFeCo and CoFe. A tantalum cap may be formed between the bottom conductor and the free layer. Whether in intimate contact with the bottom conductor or the cap, the free FM layer may be amorphous or small-grained. It has been found that an amorphous free FM layer has better switching characteristics than a free FM layer that was seeded.

Insulating tunnel barrier material is formed on the free FM layer material (330). For example, $Al_2O_3$ may be deposited by r-f sputtering, or by depositing aluminum and then oxidizing the deposited aluminum by a process such as plasma oxidation.

Pinned FM layer material is deposited on the insulating tunnel barrier material (340). The pinned FM layer material is also amorphous.

At least one interface property at the upper surface of the pinned FM layer material is adjusted (350). Ion etching may be performed by bombarding the pinned layer material with argon ions or any other non-reactive ions. The ion etching may be performed in-situ in a deposition chamber.

The amount of ion etching is device-dependent. For example, it has been found that the ion etching up to a critical level reduces surface roughness, but beyond that level, the surface roughness begins to increase.

AF pinning layer material is deposited on the surface of the pinned FM layer material (360). An exemplary AF pinning layer material is IrMn.

The ferromagnetic layers may be deposited in the presence of an applied magnetic field to establish a uniaxial magnetic anisotropy. In addition, a post-anneal may be performed to optimize the exchange pinning field (370). However, the increased exchange coupling allows the post anneal to be performed with lower temperatures and shorter durations. Added benefits of the lower temperatures and the shorter durations include less interdiffusion in the various layers of the magnetic tunnel junction, and less chance of damage to the insulating tunnel barrier material.

This stack of material is patterned into a bit (380), and a top conductor is formed on the AF pinning layer (390). The top conductor may be made of a metal such as aluminum or copper. A tantalum cap may be formed between the top conductor and the pinning layer.

An advantage of ion etching is that it allows the magnetic characteristics of the free and pinned layers to be adjusted in a controlled manner. Increasing the duration of the ion etching can increase the exchange bias and, therefore, exchange coupling, in a proportional manner. The free layer coercivity can be increased, and the FM coupling can be reduced, monotonically with ion etch time within a particular range. The time range depends upon the material and the magnetic characteristic to be optimized. For example, optimal exchange coupling and optimal free layer coercivity might occur at different etch times, whereby only one of these characteristics would be optimized.

Another advantage of this method is that the magnetic characteristics of the free layer can be adjusted without touching the insulating tunnel barrier. The magnetic characteristics are adjusted after the pinned FM layer is formed on the insulating tunnel barrier. Thus this method avoids the risk of creating pinholes and other defects in the insulating tunnel barrier (the pinholes can cause the magnetic tunnel junction to short).

Yet another advantage of the ion etching is that redeposited material on the surface of the pinned layer fills in grain boundaries. As a result, grain boundary diffusion into the pinning layer is blocked. Reduction of grain boundary diffusion by redeposition of the ion etched material in the grain boundaries can improve the thermal stability of the magnetic tunnel junction.

The ion etching can increase the available choices of material for the pinning or pinned layers. For example, higher amounts of cobalt may be used. Increasing the cobalt content can increase the exchange energy between the pinning and pinned layers. Cobalt also acts as a good diffusion barrier for manganese (e.g., an IrMn pinning layer).

Figure 4:
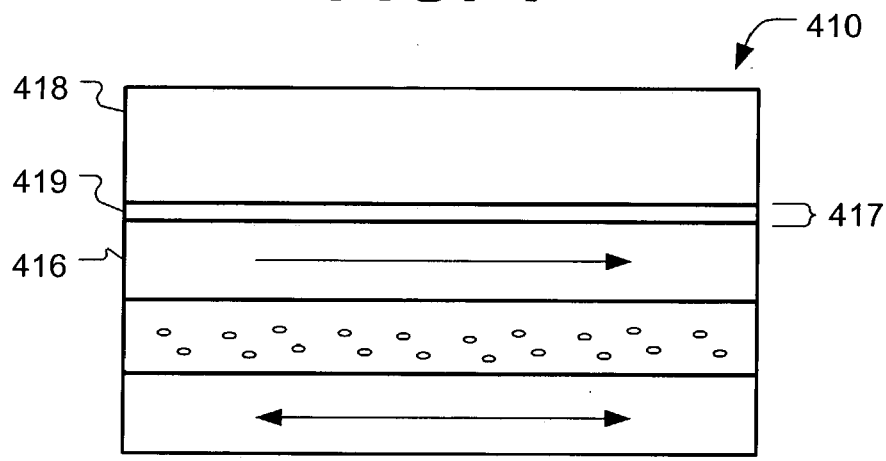
FIG. 4 is an illustration of a magnetoresistive device according to an alternative embodiment of the present invention.

The present invention is not limited to adjusting the interface properties at the upper surface of the pinned FM layer. Reference is now made to FIG. 4, which illustrates an alternative embodiment of the MTJ 410. The upper surface of the pinned FM layer 416 and the lower surface of the AF pinning layer 418 form an interface 417. The interface 417 may include one or more layers such as an interfacial FM layer 419 between the pinned and pinning layers 416 and 418. At least one interface property at an upper surface of the interfacial layer 419 may be adjusted instead of, or in addition to, the upper surface of the pinned FM layer 416.

The present invention is not limited to top-pinned magnetic tunnel junctions; the present invention covers other types of top-pinned magnetoresistive devices. For example, the present invention covers top-pinned GMR devices. A typical GMR device has a free FM layer and pinned FM layer that are separated by a conductive non-magnetic metallic layer instead of an insulating tunnel barrier. Exemplary spacer layer metals include gold, silver and copper. The relative magnetization orientations of the free layer and pinned layer affect in-plane resistance of a GMR device (as opposed to through-plane or perpendicular-plane resistance of a magnetic tunnel junction).

The present invention is not limited to a magnetoresistive device having a single pinned FM layer For example, the single pinned FM layer may be replaced by a structure disclosed in U.S. Ser. No. 10/463,993, now granted U.S. Pat. No. 6,989,915 or a structure disclosed in U.S. Ser. No. 10/463,930 now granted U.S. Pat. No. 7,054,119, both of which applications are incorporated herein by reference.

A magnetoresistive device according to the present invention is not limited to any particular application. Exemplary applications include MRAM devices and hard disk drives.

Figure 5:
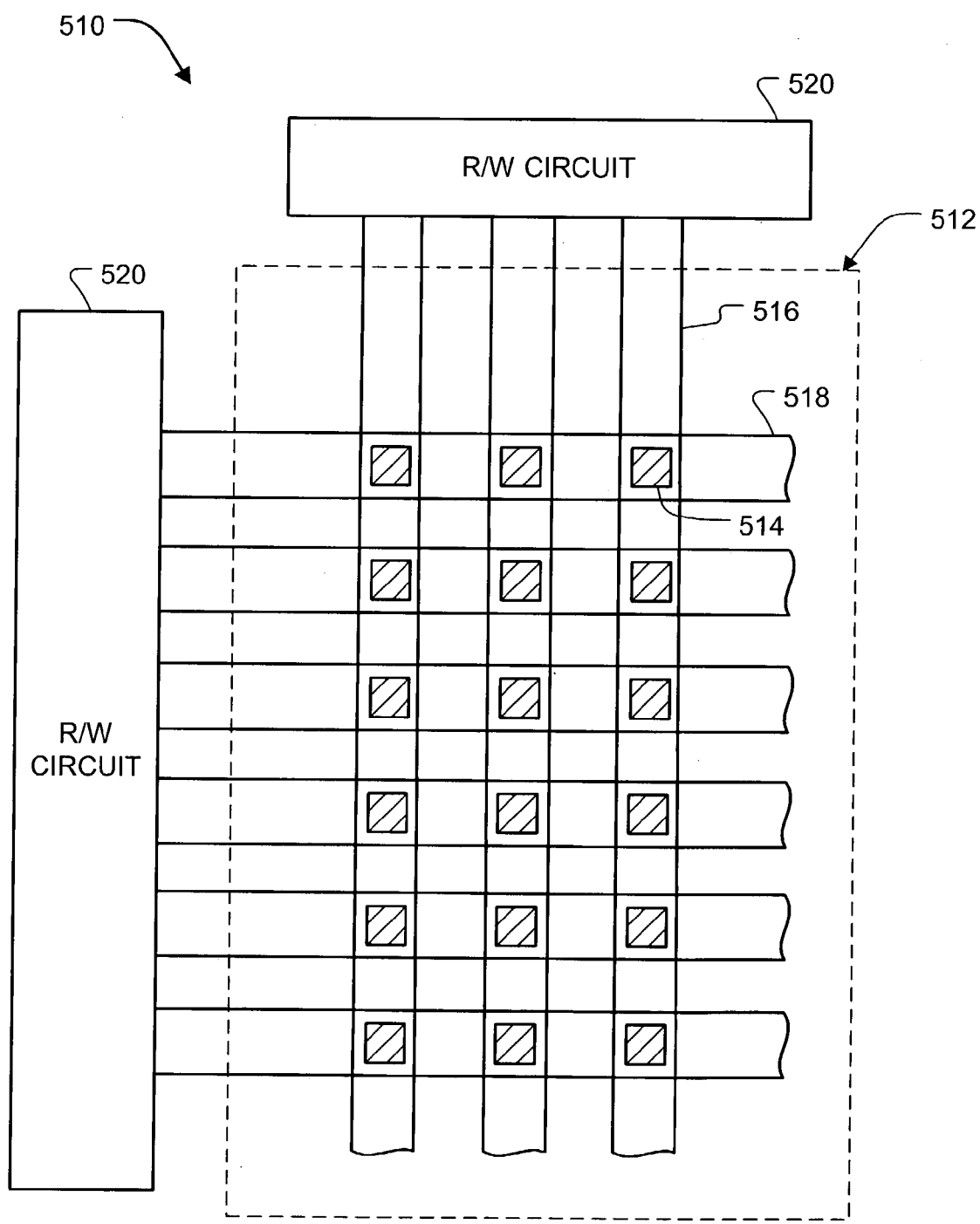
FIG. 5 is an illustration of an MRAM device according to an embodiment of the present invention.

FIG. 5 illustrates an MRAM device 510 including an array 512 of memory cells 514. Each memory cell 514 includes a magnetic tunnel junction according to the present invention. Only a relatively small number of memory cells 514 are shown to simplify the description of the MRAM device 510. In practice, arrays 512 of other sizes may be used.

Word lines 516 extend along rows of the memory cells 514, and bit lines 518 extend along columns of the memory cells 514. There may be one word line 516 for each row of the array 512 and one bit line 518 for each column of the array 512. Each memory cell 514 is located at a cross point of a word line 516 and bit line 518. Thus each magnetic tunnel junction is located at the cross point of a word line 516 and a bit line 518.

The MRAM device 510 also includes a read/write circuit 520 for performing read and write operations on selected memory cells 514. During write operations, the read/write circuit 520 supplies write currents to the word and bit lines 516 and 518 crossing a selected memory cell 514. The write currents create magnetic fields that, when combined, cause the free layer of the selected memory cell to switch cleanly (the word and bit lines 516 and 518 serve the same function as the bottom and top conductors 106 and 108 of FIG. 1). The clean switching is due in part to the separation of the pinned and free loops, and the increased squareness of the free loop.

During read operations, the read write/circuit 520 may apply a voltage across the word and bit lines 516 and 518 crossing the memory cell 514, causing a sense current to flow through the magnetic tunnel junction of the selected memory cell 514. The sense current indicates the resistance state (either $R_N$ or $R_N+\Delta R_N$). Due in part to the large exchange bias and the high exchange coupling, the pinned magnetization vector (M1) does not rotate. Consequently, the tunneling magnetoresistance is high, making it easier discern one resistance state from the other.

The present invention is not limited each memory cell 514 having only a single magnetic tunnel junction. Each memory cell may include more than one magnetic tunnel junction, or one or more magnetoresistive devices other than magnetic tunnel junctions.

The present invention is not limited to magnetoresistive devices having two stable orientations or devices having magnetization vectors (M1 and M2) that are parallel. For example, the magnetization vector (M2) of the free layer could be orthogonal to the magnetization vector (M1) of the pinned structure.

Consider the resistance of a magnetic tunnel junction having orthogonal magnetization vectors (M1 and M2). This magnetic tunnel junction has a resistance that varies as the free magnetization vector (M2) is rotated from one direction to the other. Its R-H transfer curve has a region that is roughly linear. An exemplary application for such a magnetic tunnel junction is read head for a hard disk drive.

Figure 6:
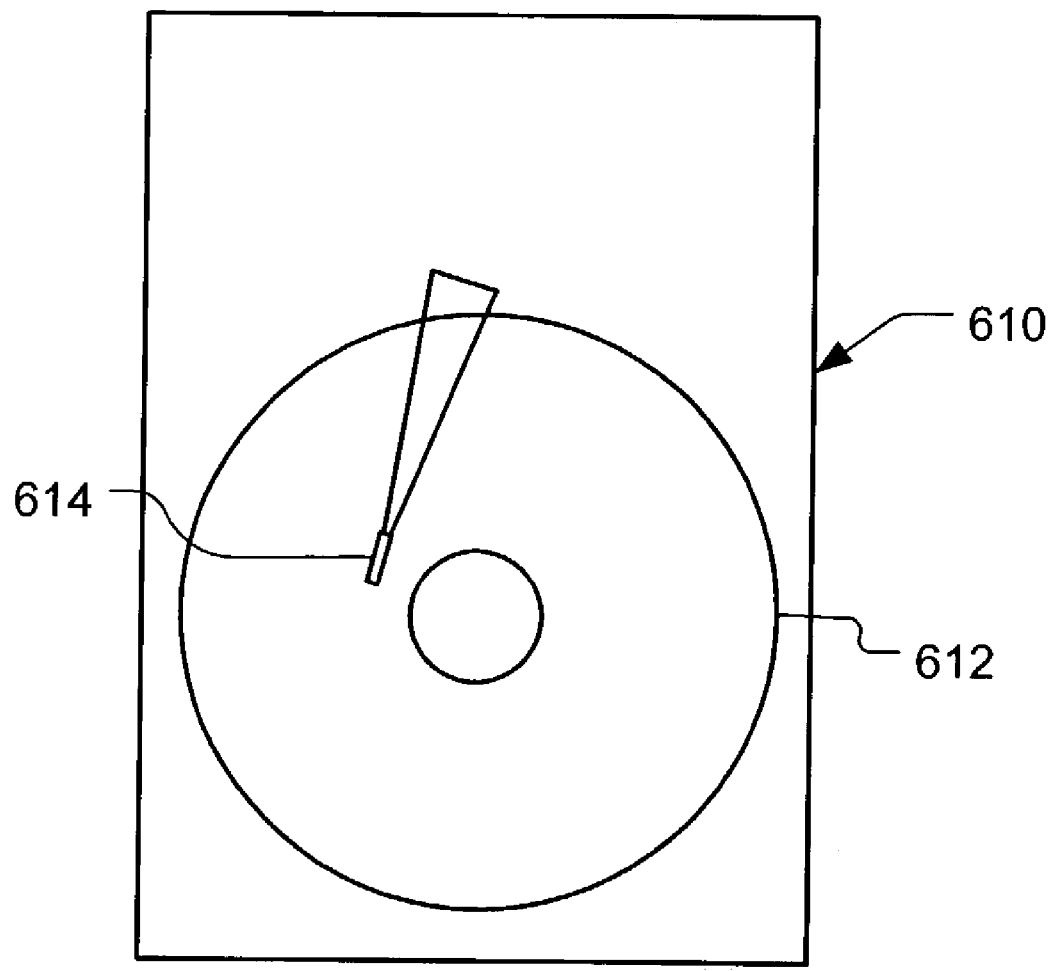
FIG. 6 is an illustration of a hard disk drive according to an embodiment of the present invention.

Reference is now made to FIG. 6, which shows a hard disk drive 610 including magnetic media disks 612. User data is stored in concentric circular tracks on the surface of each disk 612. The disk drive 610 also includes transducers 614 for performing read and write operations on the disks 612. Each transducer 614 includes a magnetoresistive device according to the present invention for the read operations (each transducer 614 may also include a thin film inductive head for the write operations). During read operations, the magnetoresistive device would be operated in the linear region of its transfer curve.

The present invention is not limited to the specific embodiments described and illustrated above. Instead, the present invention is construed according to the claims that follow.

What is claimed is:

1. A magnetoresistive device comprising:
 a free ferromagnetic layer;
 a spacer layer on the free ferromagnetic layer; and
 a pinned ferromagnetic layer on the spacer layer, the pinned layer having at least one interface property adjusted by ion etching to improve exchange coupling in the device;
 wherein the magnetoresistive device is top-pinned.

2. The device of claim 1, further comprising an AF pinning layer on the pinned layer; wherein the at least one interface property is adjusted to increase exchange coupling between the pinned and pinning layers.

3. The device of claim 1, wherein the at least one interface property also adjusts magnetic characteristics of the device.

4. The device of claim 3, wherein the magnetic characteristics include a shifted H-M loop of the free layer loop to compensate for FM coupling between the free and pinned layer.

5. The device of claim 3, wherein the magnetic characteristics include the squareness of H-M loops of the free and pinned layer.

6. The device of claim 1, wherein the at least one interface property is adjusted to increase coercivity of the free layer.

7. The device of claim 1, wherein the at least one interface property includes surface texture and grain size.

8. The device of claim 1, wherein the spacer layer includes an insulating tunnel barrier.

9. The device of claim 1, further comprising an interfacial layer on the free ferromagnetic layer, the interfacial layer having at least one adjusted interface property.

10. The device of claim 1, wherein the free layer and pinned layers are made of amorphous FM material.

11. The device of claim 1, wherein the spacer layer includes an insulating tunnel barrier.

12. An information storage device including at least one magnetoresistive device of claim 1.

13. A memory cell including the device of claim 1.

14. An MRAM device including an array of memory cells, each memory cell including at least one device of claim 1.

15. A read head for a hard drive, the read head including the device of claim 1.

16. A hard disk drive including at least one device of claim 1.

17. A magnetoresistive device comprising:
 a free ferromagnetic layer;
 a spacer layer on the free ferromagnetic layer;
 a pinned ferromagnetic layer on the spacer layer; and
 an antiferromagnetic pinning layer on the pinned layer;
 the pinned and pinning layers forming an interface, the interface having been ion etched to improve exchange coupling between the pinned and pinning layers.

18. A method of forming the magnetoresistive device of claim 1, the method comprising:
  forming the free ferromagnetic layer;
  forming the spacer layer on the free layer;
  forming the pinned ferromagnetic layer on the spacer layer; and adjusting the at least one interface property at an upper surface of the pinned layer.

19. The method of claim 1, further comprising depositing an AF pinning layer on the pinned layer; wherein the at least one interface property is adjusted to increase exchange coupling between the pinned and pinning layers.

20. The method of claim 1, wherein the at least one interface property is adjusted to shift an H-M loop of the free layer loop to compensate for FM coupling between the free and pinned layers.

21. The method of claim 1, wherein the at least one interface property is adjusted to improve squareness of H-M loops of the free and pinned layers.

22. The method of claim 1, wherein the at least one interface property is adjusted to adjust magnetic characteristics of the free layer.

23. The method of claim 22, wherein the magnetic characteristics include FM coupling.

24. The method of claim 22, wherein the magnetic characteristics include coercivity of the free layer.

25. The method of claim 1, wherein the adjusting includes adjusting texture of the upper surface.

26. The method of claim 1, wherein the adjusting includes filling in grain boundaries at the upper surface of the pinned layer.

27. The method of claim 1, wherein at least some magnetic characteristics of the device are controlled by controlling ion etch rate and duration.

28. The method of claim 1, further comprising forming an interfacial layer on the pinned layer; and adjusting at least one interface property at an upper surface of the interfacial layer.

29. The method of claim 1, wherein forming the spacer layer includes forming an insulating tunnel barrier.

30. The method of claim 1, wherein the free layer is not seeded.

* * * * *

UNITED STATES PATENT AND TRADEMARK OFFICE
CERTIFICATE OF CORRECTION

PATENT NO. : 7,151,652 B2 Page 1 of 1
APPLICATION NO. : 10/464161
DATED : December 19, 2006
INVENTOR(S) : Janice H. Nickel et al.

It is certified that error appears in the above-identified patent and that said Letters Patent is hereby corrected as shown below:

In column 6, line 32, in Claim 4, delete "layer." and insert -- layers. --, therefor.

In column 7, line 8, in Claim 19, delete "claim 1" and insert -- claim 18 --, therefor.

In column 7, line 12, in Claim 20, delete "claim 1" and insert -- claim 18 --, therefor.

In column 7, line 16, in Claim 21, delete "claim 1" and insert -- claim 18 --, therefor.

In column 7, line 19, in Claim 22, delete "claim 1" and insert -- claim 18 --, therefor.

In column 8, line 3, in Claim 25, delete "claim 1" and insert -- claim 18 --, therefor.

In column 8, line 6, in Claim 26, delete "claim 1" and insert -- claim 18 --, therefor.

In column 8, line 9, in Claim 27, delete "claim 1" and insert -- claim 18 --, therefor.

In column 8, line 13, in Claim 28, delete "claim 1" and insert -- claim 18 --, therefor.

In column 8, line 17, in Claim 29, delete "claim 1" and insert -- claim 18 --, therefor.

In column 8, line 20, in Claim 30, delete "claim 1" and insert -- claim 18 --, therefor.

Signed and Sealed this

Thirtieth Day of June, 2009

JOHN DOLL
*Acting Director of the United States Patent and Trademark Office*